(12) United States Patent
Yang et al.

(10) Patent No.: US 8,312,736 B2
(45) Date of Patent: Nov. 20, 2012

(54) COLD PLATE AND REFRIGERATION SYSTEM

(75) Inventors: Kai-Shing Yang, Changhua County (TW); Chi-Chuan Wang, Hsinchu County (TW); Shih-Jie Lin, Koahsiung County (TW); Yu-Lieh Wu, Taipei County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 902 days.

(21) Appl. No.: 12/417,336

(22) Filed: Apr. 2, 2009

(65) Prior Publication Data

US 2010/0126209 A1 May 27, 2010

(30) Foreign Application Priority Data

Nov. 26, 2008 (TW) ................. 97145608 A

(51) Int. Cl.
*F25D 11/00* (2006.01)
(52) U.S. Cl. ....................................... 62/430
(58) Field of Classification Search ............ 62/434, 62/498, 515, 430; 165/104.21, 181
See application file for complete search history.

(56) References Cited

U.S. PATENT DOCUMENTS 5,959,351 A * 9/1999 Sasaki et al. ............... 257/714

FOREIGN PATENT DOCUMENTS

| TW | 271144 | 7/2005 |
| TW | 294686 | 7/2006 |
| TW | 200815718 | 4/2008 |

OTHER PUBLICATIONS

Taiwan Intellectual Property Office, "Office Action", Mar. 2, 2011, Taiwan.

* cited by examiner

*Primary Examiner* — Melvin Jones
(74) *Attorney, Agent, or Firm* — WPAT PC; Justin King

(57) ABSTRACT

A cold plate including a cold wall, a first cavity, a first pipe, a second cavity, an expansion unit and a second pipe is provided. The first cavity covers on the cold wall to form a first fluid space, and the first pipe is connected with the first cavity. The second cavity is disposed inside the first cavity and covers on the cold wall to form a second fluid space. The expansion unit is disposed between the second cavity and the cold wall to interconnect the first fluid space and the second fluid space. The second pipe is disposed inside the first pipe and connected with the second cavity. Besides, a refrigeration system including the cold plate mentioned above is also provided.

15 Claims, 3 Drawing Sheets

COLD PLATE AND REFRIGERATION SYSTEM

FIELD OF THE INVENTION

The present invention relates to a refrigeration system and its cold plate, and more particularly, to a refrigeration system and its cold plate with anti-condensation ability.

BACKGROUND OF THE INVENTION

With rapid advance of packaging technology and manufacturing process in integrated circuit (IC) industry, the IC packaging density and the operation speed of an electronic component are increasing rapidly therewith. However, the ever increasing high-speed operation frequency and the reduction of circuit line width will cause the power dissipation of electronic components to increase. Notably, in those electronic components that are damaged during operation, there are more than 55% of such damage are caused by overheating. Moreover, as indicated in many researches, the operation efficiency of a chip can be increased by 1% to 3% whenever its temperature is reduced by 10° C. which may lead to an conclusion that the life expectancy as well as the operation stability of electronic equipments can be greatly affected by their operation temperature. Thus, a good heat dissipation design is the key for electronic components to operate with higher reliability, higher stability and longer life span, and so on, not to mention that it can help overcoming the obstacle restricting the development of high speed IC chips. In addition, except for the IC chips, the same performance problem caused by high temperature and power dissipation can also been find in other devices, such as light emitting diode (LED), solar cell module, etc.

The heat dissipation systems that are currently available are either air cooling or water cooling. Both systems can only dissipate heat from a heat source and thus cause the temperature of the same to cool down to nearly it's ambient room temperature so that both systems may not have good heat dissipation efficiency especially for those high performance, high operation temperature electronic components. Thus, the refrigeration system can be one of the heat dissipation means suitable for those high performance, high operation temperature electronic components, and moreover, it is the few means that can cool down an electronic component to lower than its ambient room temperature. However, such refrigeration system is disadvantageous in that: it can cause moisture in the surrounding air of the electronic component to condense thereon and thus cause instability or even malfunction to the electric circuits in the electronic component, which is true especially for those cold plates that are disposed in direct contact with electronic components for heat dissipation. Since there can be many water drops being condensed on the surface of such clod plate that are more than likely to flow on the electronic component relating to the clod plate, such as IC chip or circuit board, circuit instability or malfunction in those IC chips or circuit board can be caused inevitably. Consequently, the application of such refrigeration system in electronic component is restricted.

SUMMARY OF THE INVENTION

In view of the aforesaid description, the present invention relates to a cold plate and a refrigeration system using the same, capable of preventing moisture in surrounding to condense directly on the cold plate so as to improve the heat dissipation quality of the same.

The present invention provides a cold plate including a cold wall, a first cavity, a first pipe, a second cavity, an expansion unit and a second pipe, in which the first cavity covers on the cold wall to form a first fluid space, and the first pipe is connected with the first cavity; the second cavity is disposed inside the first cavity and covers on the cold wall to form a second fluid space; the expansion unit is disposed between the second cavity and the cold wall to interconnect the first fluid space and the second fluid space; and the second pipe is disposed inside the first pipe and connected with the second cavity.

The present invention further provides a refrigeration system comprising: a compressor, a condenser, an expander, and the aforesaid cold plate, in which the condenser is disposed at a position between the expander and the compressor to interconnect the two; the cold plate is disposed at a position between the expander and the compressor to interconnect the two while having an expansion unit to be embedded therein for enabling the same to be used as an evaporator as the compressor, the condenser, the expander and the cold plate are connected and thus forms a closed circulation circuit. In addition, in the refrigeration system, the first pipe is connected to the expander and the second pipe is connected to the compressor.

In an exemplary embodiment of the invention, a coolant flowing into the first fluid space through the first pipe is directed to flow into the second fluid space through the expansion unit, where it is further directed to flow out of the clod plate through the second pipe, during which the temperature of the coolant flowing in the first fluid space is higher than its dew point temperature while the temperature of the coolant flowing in the second fluid space is lower than its dew point temperature.

Accordingly, in the cold plate and the refrigeration system using the same, the design for enabling the temperature of the coolant flowing in the first fluid space to be higher than its dew point temperature is for preventing moisture in surrounding air from condensing. Moreover, by the pressure dropping of the expansion unit, the temperature of the coolant flowing through the expansion unit and then into the second fluid space is dropped to lower the dew point temperature for greatly improving the heat dissipation effect.

In addition, the double-pipe design adopted in the present invention, i.e. the disposition of the second pipe inside the first pipe, is used for enabling the coolant whose temperature is lower than the dew point temperature to flow in the second pipe while allowing those whose temperature is higher than the dew point temperature to flow in the first pipe that is outside the second pipe so that both pipes can be prevented from condensation.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
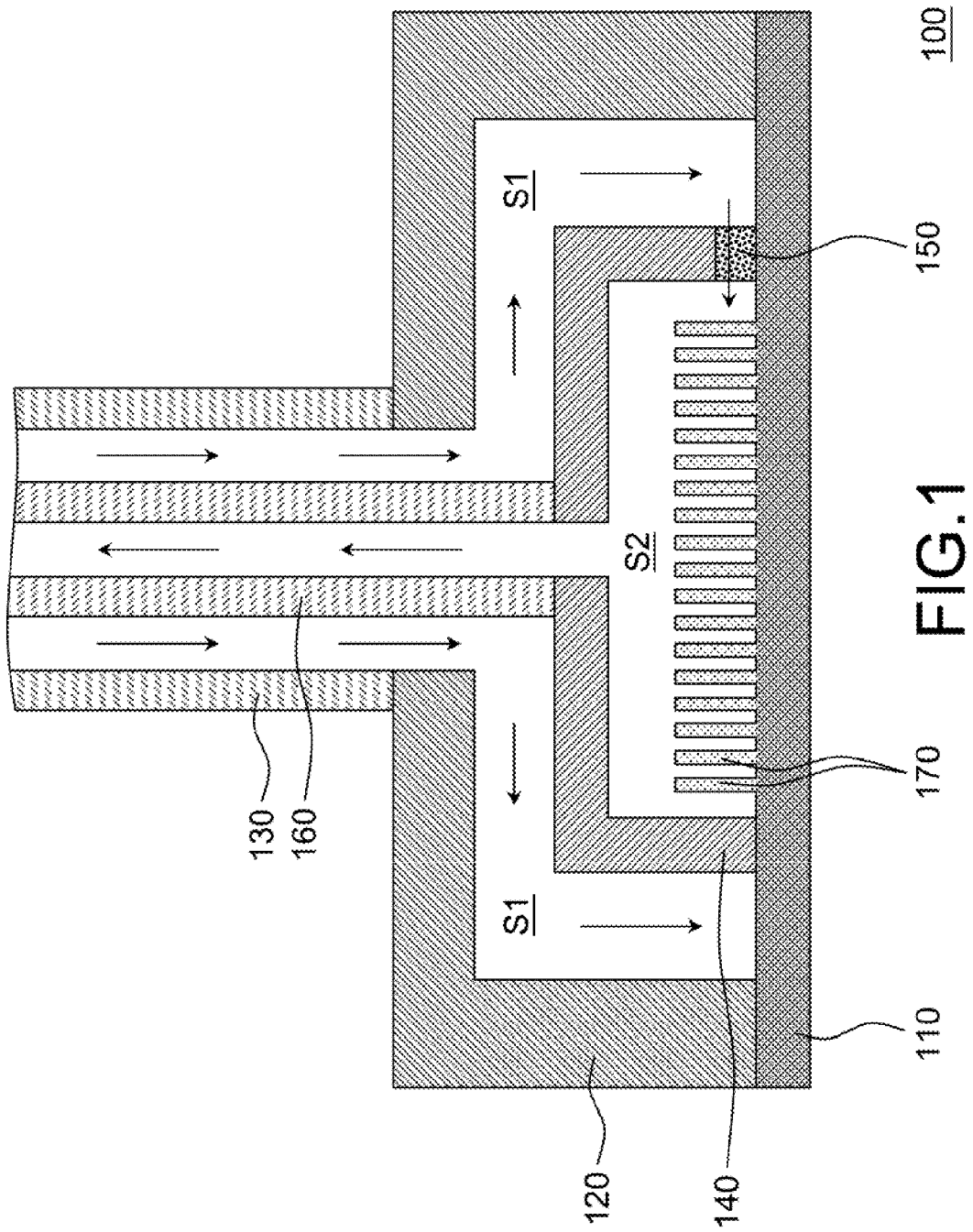
FIG. 1 is a sectional view of a cold plate according to an embodiment of the invention.

Please refer to FIG. 1, which is a sectional view of a cold plate according to an embodiment of the invention. In FIG. 1, the cold plate 100 includes a cold wall 110, a first cavity 120, a first pipe 130, a second cavity 140, an expansion unit 150 and a second pipe 160. It is noted that the cold plate 100 adopts a double-cavity, double-pipe design and it uses the expansion unit 150 as a medium for pressure dropping a coolant flowing in the cold plate 100 and thus enabling the temperature of the coolant to change in different spaces in the cold plate 100. Moreover, the coolant is flowing in directions indicated by the arrows in FIG. 1.

Basically, the first cavity 120 is arranged covering on the cold wall 110 for forming a first fluid space S1; and the second cavity 140, being received inside the first cavity 120, is also arranged covering on the cold wall 110 for forming a second fluid space S2. Thereby, a double-cavity structure is achieved. In addition, As the first pipe 130 is connected to the first cavity 120 while the second pipe 160 is received inside the first pipe 130 while connecting to the second cavity 140, a double-pipe structure is achieved.

Moreover, the cold wall 110 is structured for contacting directly with a heat source so as to enable the heat from the heat source to be transmitted rapidly to the cold wall where it can be brought away and thus dissipated by the ever-flowing coolant. It is noted that the heat source can be an integrated circuit (IC) chip, a light emitting diode (LED), a solar cell or any heat-generating objects. In addition, the expansion unit is disposed at a position between the second cavity 140 and the cold wall 110 for connecting the first fluid space S1 and the second fluid space S2.

In detail, the coolant is provided to flow into the first fluid space S1 through the first pipe 130 for pressure-dropping by the use of the expansion unit 150, and then is directed to flow into the second fluid space S2 for absorbing heat transmitted from the cold wall 110, and thereafter, the coolant is further directed to flow out of the clod plate 100 through the second pipe 160, so that heat from the heat source can be dissipated by the cold plate 100 rapidly.

Notably, the temperature of the coolant flowing in the first fluid space S1 is higher than its dew point temperature, i.e. the temperatures relating to the outside of the first cavity 120 and the first pipe 130 are higher than the dew point temperature, by that there will be no condensation happening at the outside of the first cavity 120 and the first pipe 130, i.e. the surface of the cold plate 100 and thus the reliability of the cold plate 100 can be improved.

Moreover, the temperature of the coolant flowing in the second fluid space S2 is lower than its dew point temperature, by that the heat dissipating efficiency is enhanced. It is noted that the cold wall 100 is the only portion exposed to the outside of the cold plate 100 whose temperature is lower than the dew point temperature, However, as the cold wall 110 is configured for contacting directly to the seat source, it will not troubled by the condensation problem also. From the above description, it is clear that the cold plate 100 of the invention is able to overcome the condensation problem troubling those convention heat dissipation systems and at the same time without any comprise in its heat dissipating efficiency.

It is emphasized that by the a double-cavity, double-pipe design of having the second pipe 160 and second cavity 140 to be received inside the first pipe 130 and the first cavity 120, the coolant flowing the second fluid space whose temperature is lower than dew point temperature will absorb heat from the heat source through the cold wall 110 while enabling the coolant flowing in the first fluid space S1 whose temperature is higher than the dew point temperature to be use as insulator for preventing the cold plate 100 from condensation.

For improving heat transmission, the cold plate 100 can be configured with a plurality of fins 170 in a manner that each fin is connected to the cold wall 110 while being received inside the second fluid space S2. Thereby, as the configuration of the plural fins can greatly improve the effective heat dissipation area related to the coolant, the heat from the heat source can be dissipated rapidly through the use of the plural fins 170. In this embodiment, the plural fins 170 can the cold wall 110 are integrally formed that are made of a metal of good heat conduction coefficient. However, the first cavity 120 and the second cavity 140 should be made of a material of good thermal insulation. It is noted that the cold wall 110, the first cavity 120 and the second cavity 140 can be made of any material fit to the above description without further restrictions.

In this embodiment, the expansion unit 150 can be structured as a capillary structure, by that pressure of the coolant can be dropped after passing therethrough and thus the temperature of the coolant is decreased. It is noted that the aforesaid pressure dropping in the expansion unit 150 can be configured to operate cooperatively with a complete refrigeration system where another pressure dropping can be perform. The operation principle of the refrigeration system will be described hereinafter.

Figure 2:
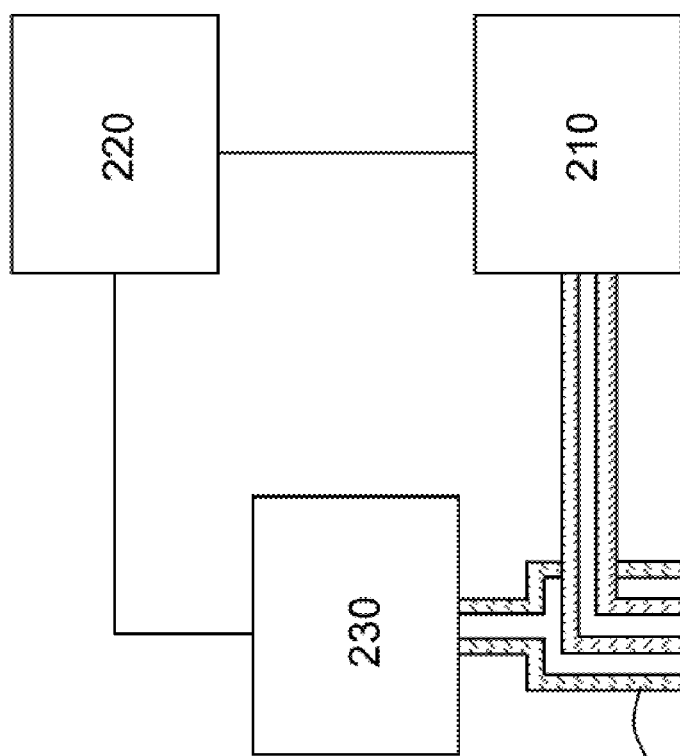
FIG. 2 is a schematic view of a refrigeration system according to an embodiment of the invention.
Figure 3:
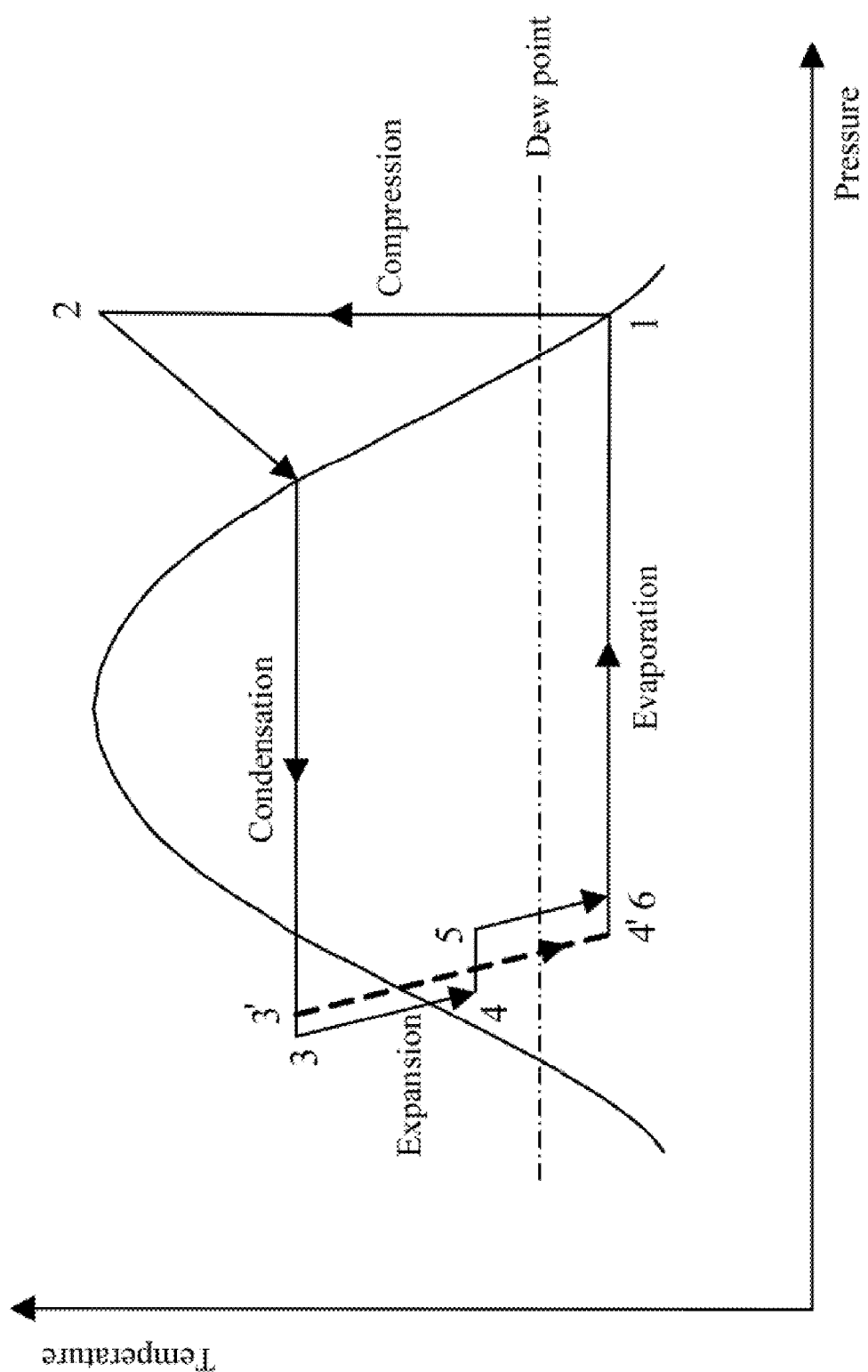
FIG. 3 is a pressure-temperature diagram depicting the comparison of coolant circulation in a conventional cold plate and a cold plate of the invention.

Please refer to FIG. 2 and FIG. 3, which are respectively a schematic view of a refrigeration system according to an embodiment of the invention, and a pressure-temperature diagram depicting the comparison of coolant circulation in a conventional cold plate and a cold plate of the invention. The refrigeration system 200 of FIG. 2 includes a compressor 210, a condenser 220, an expander 230 and the cold plate 100 of FIG. 1. It is noted that the components of the cold plate 100 used in the refrigeration system 200 of FIG. 2 will adopt the same numbering for the sake of convenience. In this embodiment, the condenser 220 is disposed at a position between the expander 230 and the compressor 210 to interconnect the two; and the cold plate 100 is disposed at a position between the expander 230 and the compressor 210 to interconnect the two so as to be used as a conventional evaporator. The compressor 210, the condenser 220, the expander 230 and the cold plate 100 are connected and thus forms a closed circulation circuit for the coolant to flow sequentially therein. In addition, in the refrigeration system 200, the first pipe 130 is connected to the expander 230 and the second pipe 160 is connected to the compressor 210.

In this embodiment, both the expander 230 and the expansion unit 150 in the cold plate 100 are capillary structures, by that the pressure-dropping process can be performed twice. In the coolant circulation depicted in FIG. 3, the coolant is first being pressurized by the compressor 210 for enabling the same to change from phase 1 to phase 2 while having its temperature that is lower than the dew point temperature to be increased to an extent that is higher than the dew point temperature. Then, the coolant is directed to flow through the condenser 220 where it is changed from phase 2 to phase 3. Thereafter, the coolant is fed to the expander 230 for the first pressure dropping so as to change the phase-3 coolant to phase 4. It is noted that the length of the capillary in the expander 230 should be carefully adjusted for enabling the temperature of the coolant passing through the expander 230 to be maintained higher than the dew point temperature so as to prevent condensation.

After passing through the expander 230, the coolant will change from phase 4 to phase 5 in the journey to the cold plate 100. In the expansion unit 150 of the cold plate 100, the coolant is pressure dropping for the second time and thus it is changed from phase 5 to phase 6, by that the temperature of the coolant in the second fluid space S2 is reduced to lower than the dew point temperature for enabling the same to absorb heat from the heat source. After absorbing heat from the heat source, the coolant is change from phase 6 back to phase 1, and thus complete a circulation.

For those conventional heat dissipation devices without double-cavity, double-pipe design, the only once pressure dropping is performed when the coolant is flowing through the expander 230 where the coolant is in phase 4' while its temperature is dropped directly to a point that is lower than the dew point temperature. Accordingly, in the circulation happening in those conventional heat dissipation devices, the phase of the coolant is changed as following: phase 1→phase 2→phase 3'→phase 4', as marked by the dotted lines in FIG. 3. Since the temperature of the coolant is lower than the dew point temperature before it enters the cold plate, the cold plate can not avoid from condensation and thus the reliability as well as the stability of the heat dissipating system is adversely affected.

Although in the aforesaid embodiment of the invention the condensation is prevented by the two pressure-dropping processes, the characteristic of the present invention is to provide a double-cavity, double-pipe cold plate 100 embedded with the expansion unit 150 that can enable those coolant flowing therein whose temperature is lower than dew point temperature to be completely received in and thus isolated by those other coolant whose temperature is higher than dew point temperature. Accordingly, the expander 230 can be omitted from the refrigeration system 200 shown in FIG. 2 as the capillary length in the expansion unit 150 can be increased for enabling the coolant to change directly from phase 3; to phase 4' by only one pressure dropping as it is flowing in the cold plate 100. The operation and principle of the aforesaid description is clear to those skilled in the art and thus is not described further herein.

To sum up, the cold plate and the refrigeration system using the same has the following advantages:

(1) The design of the invention enables the temperature of the coolant flowing in the first fluid space to be higher than its dew point temperature for preventing moisture in surrounding air from condensing. Moreover, by the pressure dropping of the expansion unit, the temperature of the coolant flowing through the expansion unit and then into the second fluid space is dropped to lower the dew point temperature, the heat dissipation effect can be greatly enhanced.

(2) The double-cavity, double-pipe design adopted in the present invention, i.e. the disposition of the second cavity inside the first cavity and the second pipe inside the first pipe, is used for enabling the coolant whose temperature is lower than the dew point temperature to flow in the second pipe that is in the interior of the cold plate while allowing those whose temperature is higher than the dew point temperature to flow in the first pipe that is on the exterior of the cold plate so that the cold plate can be prevented from condensation.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A cold plate, comprising:
a cold wall;
a first cavity, covering on the cold wall for forming a first fluid space;
a first pipe, connected with the first cavity;
a second cavity, disposed inside the first cavity while covering on the cold wall to form a second fluid space;
an expansion unit, disposed between the second cavity and the cold wall to interconnect the first fluid space and the second fluid space; and
a second pipe, disposed inside the first pipe and connected with the second cavity.

2. The cold plate of claim 1, wherein a coolant is provided to flow into the first fluid space through the first pipe and then is directed to flow into the second fluid space through the expansion unit, where it is further directed to flow out of the clod plate through the second pipe.

3. The cold plate of claim 2, wherein the coolant's temperature is higher than its dew point temperature while the coolant is flowing in the first fluid space, and the coolant's temperature is lower than its dew point temperature while the coolant is flowing in the second fluid space.

4. The cold plate of claim 1, wherein the expansion unit is a capillary structure.

5. The cold plate of claim 1, wherein the cold wall is directly in contact with a heat source.

6. The cold plate of claim 5, wherein the heat source is a device selected from the group consisting of: an integrated circuit (IC) chip, a light emitting diode (LED) and a solar cell.

7. The cold plate of claim 1, further comprising:
a plurality of fins, each connected to the cold wall and disposed inside the second fluid space.

8. A refrigeration system, comprising:
a compressor;
an expander;
a condenser, disposed at a position between the expander and the compressor for allowing the compressor, the condenser, the expander and a cold plate to be interconnected and thus form a closed circulation circuit; and
a cold plate, further comprising:
a cold wall;
a first cavity, covering on the cold wall for forming a first fluid space;
a first pipe, connected with the first cavity and the expander;
a second cavity, disposed inside the first cavity while covering on the cold wall to form a second fluid space;
an expansion unit, disposed between the second cavity and the cold wall to interconnect the first fluid space and the second fluid space; and
a second pipe, disposed inside the first pipe for connecting the second cavity to the compressor.

9. The refrigeration system of claim 8, wherein a coolant is provided to flow into the first fluid space through the first pipe and then is directed to flow into the second fluid space through the expansion unit, where it is further directed to flow out of the clod plate through the second pipe.

10. The refrigeration system of claim 9, wherein the coolant's temperature is higher than its dew point temperature while the coolant is flowing in the first fluid space, and the coolant's temperature is lower than its dew point temperature while the coolant is flowing in the second fluid space.

11. The refrigeration system of claim 8, wherein the expansion unit is a capillary structure.

12. The refrigeration system of claim 8, wherein the expander is a capillary structure.

13. The refrigeration system of claim 8, wherein the cold wall is directly in contact with a heat source.

14. The refrigeration system of claim 13, wherein the heat source is a device selected from the group consisting of: an integrated circuit (IC) chip, a light emitting diode (LED) and a solar cell.

15. The refrigeration system of claim 8, further comprising:

a plurality of fins, each connected to the cold wall and disposed inside the second fluid space.

* * * * *